United States Patent
Caesar et al.

[11] Patent Number: 6,133,767
[45] Date of Patent: *Oct. 17, 2000

[54] DIGITAL DRIVER CIRCUIT FOR AN INTEGRATED CIRCUIT

[75] Inventors: Knut Caesar; Norbert Greitschus, both of Freiburg, Germany

[73] Assignee: Micronas Intermetall GmbH, Freiburg, Germany

[*] Notice: Under 35 U.S.C. 154(b), the term of this patent shall be extended for 316 days.

[21] Appl. No.: 08/558,670

[22] Filed: Nov. 16, 1995

[30] Foreign Application Priority Data

Nov. 22, 1994 [DE] Germany .......................... 944 41 523

[51] Int. Cl.$^7$ ........................................ H03K 3/00
[52] U.S. Cl. .............................. 327/108; 326/87; 327/112
[58] Field of Search ................... 327/108–112, 374–377, 327/384, 427; 326/82, 87

[56] References Cited

U.S. PATENT DOCUMENTS

| | | | |
|---|---|---|---|
| 4,595,844 | 6/1986 | Shen | 326/87 |
| 5,021,684 | 6/1991 | Ahuja et al. | 326/87 |
| 5,216,289 | 6/1993 | Hahn et al. | 326/87 |
| 5,231,311 | 7/1993 | Ferry et al. | 326/87 |
| 5,287,527 | 2/1994 | Delp et al. | 326/87 |

FOREIGN PATENT DOCUMENTS

| | | |
|---|---|---|
| 0130079 | 1/1985 | European Pat. Off. . |
| 0284356 | 9/1988 | European Pat. Off. . |
| 4233850 | 6/1992 | Germany . |

*Primary Examiner*—Kenneth B. Wells
*Attorney, Agent, or Firm*—Arthur L. Plevy; Buchanan Ingersoll PC

[57] ABSTRACT

An integrated driver circuit for driving different capacitive loads, which includes a setting element. The setting element develops a setting signal S for a given numerical measure signal M. The numerical measure signal M is developed by an input device, which is coupled to the setting element. The numerical measure signal M corresponds to one of the different capacitive loads which is driven by the driver circuit. Coupled to the setting element is an output stage, which provides an output current that corresponds to the setting signal S.

20 Claims, 2 Drawing Sheets

DIGITAL DRIVER CIRCUIT FOR AN INTEGRATED CIRCUIT

BACKGROUND OF THE INVENTION

1. Field of the Invention

The present invention relates generally to a driver circuit. More particularly, the present invention relates to a digital driver circuit for an integrated circuit (IC), particularly for ICs where both analog and digital sub-circuits are disposed on a semiconductor substrate, wherein the digital driver circuit is capable of driving a variety of capacitive loads.

2. Description of the Prior Art

Driver circuits are used to drive subsequent load components which have capacitive elements. The capacitance of the load determines the current required to recharge the load. For large capacitances and fixed recharging times, a high current is necessary. Because of the inductances and resistances present in the circuit, a high recharging current causes interference voltages and dips in supply voltages, which corresponds to noise of the internal voltage supply and noise of the input signal, respectively. In addition, the noise increases with the number of recharging processes and the recharging speed.

In the case of an IC with a large number of digital outputs having high data rates, the interference caused by the input-signal noise is particularly strong. In addition, the capacitance of the load being driven by the driver circuit depends on the respective application, i.e., on the respective customer. Thus, the driver circuit must be designed to be used with different load capacitances. This makes it difficult to optimally match the current to the subsequent circuitry and precisely predetermine the output power of the driver circuit.

The driver circuit is commonly designed for the worst case load. The worst case load is the greatest load capacitance that can be used by any of the customers, and the shortest time required to recharge the load capacitance, e.g., in the case of high data rates. In that case, a high current is necessary, which results in relatively high input-signal noise. With this design, the driver circuit is adaptable for all applications, but in a more favorable case, the current will be unnecessary high, so that unnecessary noise will be produced. The current required in the best case may differ from that required in the worst case by a factor of 4, for example.

The reference DE 42 33 850 proposes a method for setting the current of an output stage of a driver circuit. By suitable current and voltage control, a time delay is achieved which results in a slower current rise. In this manner, very high current peaks are avoided. At very high data rates, however, this method cannot be used, because there is no time delay available to delay the current signals.

It is, therefore, an object of the present invention to provide a driver circuit for an integrated circuit which, even if the integrated circuit has a large number of digital outputs at high data rates, delivers different drive powers that are adapted to the respective application.

SUMMARY OF THE INVENTION

An integrated driver circuit is disclosed for driving different capacitive loads, which includes a setting means. The setting means develops a setting signal for a given numerical measure signal. The numerical measure signal is developed by an input device, which is coupled to the setting means. The numerical measure signal corresponds to one of the different capacitive loads which is driven by the driver circuit. Coupled to the setting means is an output means, which provides an output current that corresponds to the setting signal.

BRIEF DESCRIPTION OF THE DRAWING

The above objects, further features and advantages of the present invention are described in detail below in conjunction with the drawings, of which.

DETAILED DESCRIPTION OF THE DRAWING

Figure 1:
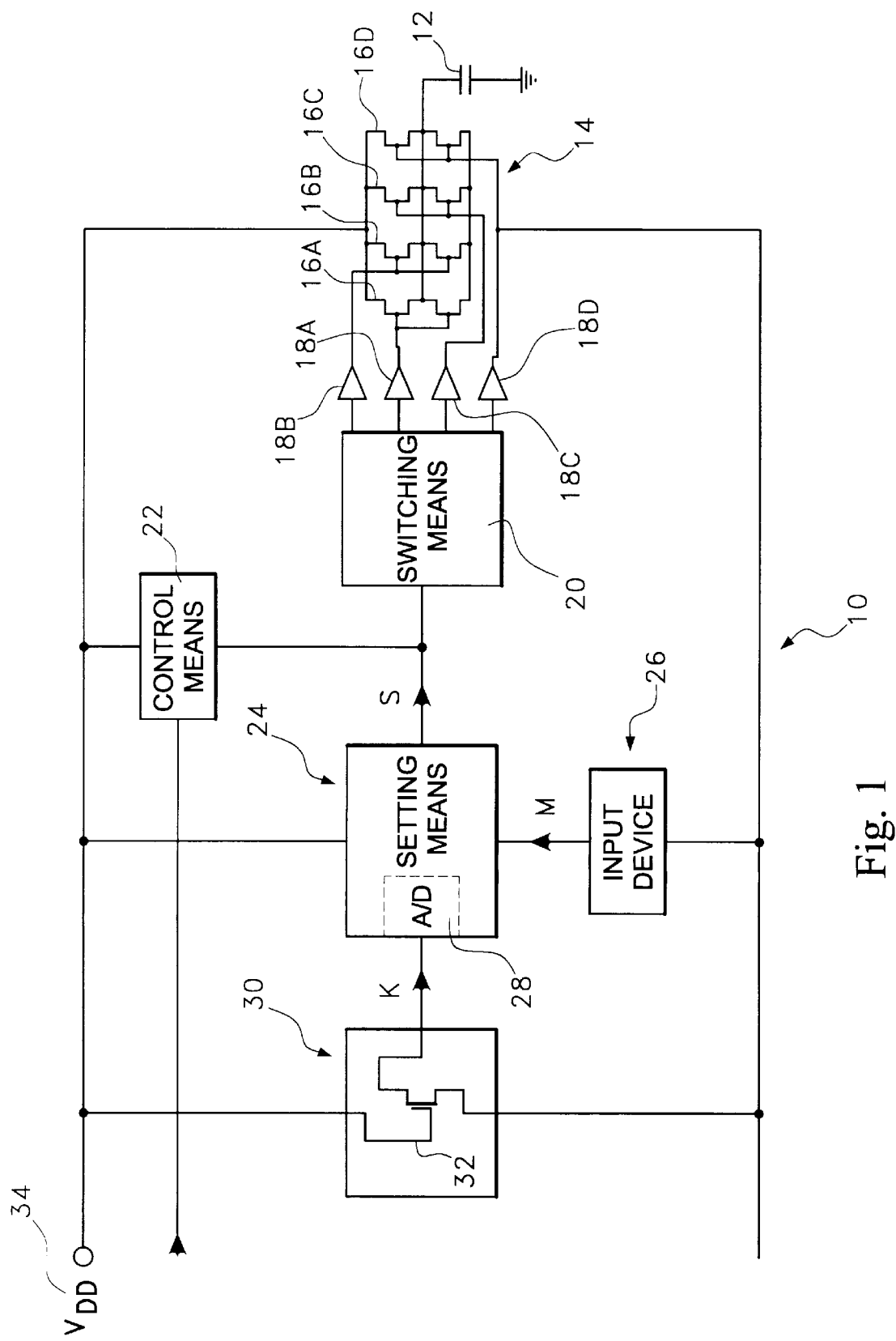
FIG. 1 is a schematic diagram of one embodiment of the digital driver circuit of the present invention.
Figure 2:
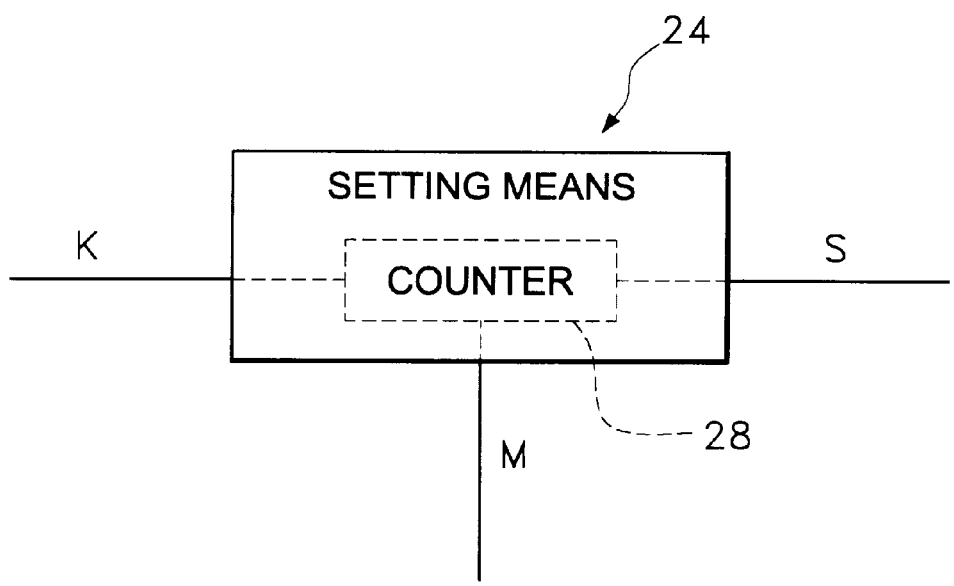
FIGS. 2 and 3 show two implementations of the setting means 24 of the present invention.
Figure 3:
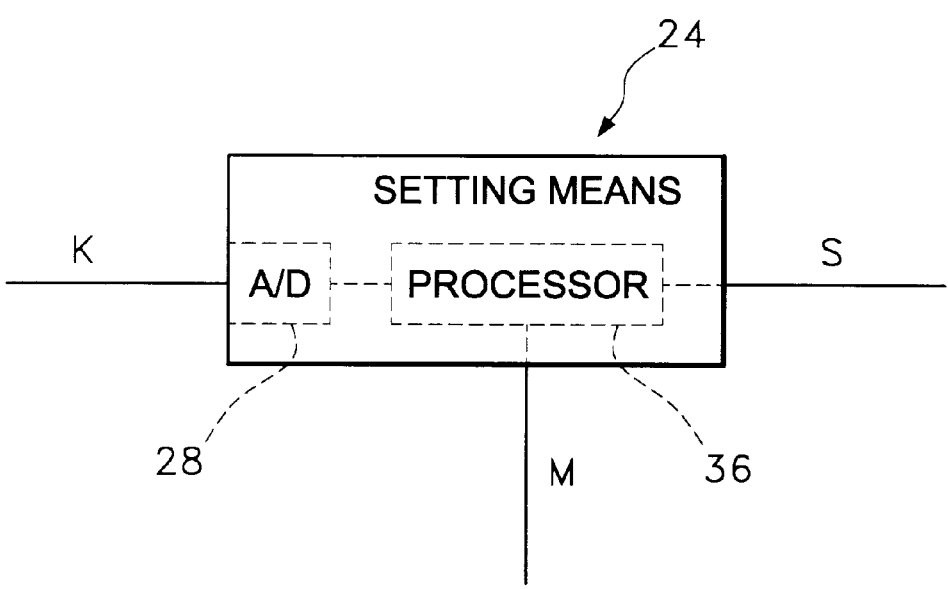

Referring to FIG. 1, there is shown an embodiment of a digital driver circuit 10 of the present invention. The drive circuit 10 is adaptable to a particular application by the user. Depending on the type of application, i.e., the load capacitance to be driven with the drive circuit 10 and data rate (the shortest time of an information change of the driver circuit), the user enters an appropriate numerical measure into the drive circuit 10, wherein the numerical measure corresponds to the particular capacitive load being driven.

The driver circuit 10 is shown connected to a load capacitance 12, which represents the capacitance component of a particular load driven by the driver circuit 10. The driver circuit 10 in this embodiment is further associated with analog and digital sub-circuits on a semiconductor substrate (not shown), e.g., a silicon chip, wherein the driver circuit 10 forms the output stage of an IC.

The driver circuit 10 has an output stage 14 which includes four parallel-connected output branches 16A,16B, 16C,16D. Each output branch includes a p-channel MOS transistor and an n-channel MOS transistor in a push-pull configuration. Alternatively, each output branch includes only one MOS transistor of one conductivity type, depending on the application. Any number of output branches can be used, depending on the application. Additionally, the output branches 16A,16B,16C,16D are weighted differently, which further enhances the drive power variability of the present invention. The weighting is implemented, for example, by different designs of the respective output transistors, particularly by choosing different w/1 ratios.

The output stage 14 further includes a switching means 20 coupled to the four output branches 16A,16B,16C,16D. The switching means 20 is utilized to selectively turn on each of the output branches 16A,16B,16C,16D, which enables the present invention to vary the drive power of the output stage in order to match the capacitive load 12 being driven. The output branches 16A,16B,16C,16D are selectively turned on by the switching means 20 developing the appropriate signals that correspond to a given setting signal S, wherein setting signal S is a digital signal. The setting means 20 is preferably embodied by a decoder circuit which is well known in the art. Coupled between the switching means 20 and the four output branches 16A,16B,16C,16D are four preamplifiers or pre-drivers 18A,18B,18C,18D. The pre-drivers 18A,18B,18C,18D provide the necessary current to turn on or drive the output branches 16A,16B,16C,16D.

The output stage 14 is shown coupled to the main DC power supply VDD 34. Alternatively, a separate power supply is provided for the output stage 14. This would enable the output stage 14 to be operated with an independent supply voltage.

Coupled to the output stage 14 is a control means 22. The control means 22 is preferably embodied by a well known switching device that is utilized to activate the output stage 14.

Further coupled to the output stage 14 is a setting means 24. The setting means 24 develops a setting signal S that determines which output branches 16A,16B,16C,16D are enabled. Thus, depending on the load capacitance 12 and the data rate, only a predetermined number of output branches 16A,16B,16C,16D is used to drive the load capacitance 12. In this manner, unnecessary noise due to unnecessary high currents in applications which do not correspond to the worst case is avoided. The output power of the driver circuit 10 is thus adaptable to the respective application. The setting means 24 further includes an analog to digital (A/D) converter 28 which will be described in greater detail later on.

Coupled to the setting means 24 is an input device 26, which enables a user to enter a numerical measure. The numerical measure is selected by the user according to the application, which determines the particular load capacitance 12 to be driven. The input device 26 develops a numeral measure signal M that corresponds to the numerical measure, which is input by the user. Based on the numerical measure signal M, the setting signal S is developed by the setting means 24.

Coupled to the setting means 24 is a measuring device 30, which contains a measuring transistor 32. The measuring device 30 is embodied as a sensor capable of measuring an electrical quantity such as the saturation current of the measuring transistor 32. The measuring device 30 measures the saturation current of the measuring transistor 32 in order to develop a correction signal K.

The correction signal K which is felt at the setting means 24 corrects the setting signal S. The setting signal S is corrected to allow for quantities that vary, such as process parameters, e.g., oxide thickness, or other parameters which exhibit process-induced variations, supply voltage $V_{DD}$, temperature, etc. Based on the correction signal K, the drive power can be chosen so that in the respective application, the minimum switching speed of the signals, i.e., the rise and fall times, is just sufficient to ensure that the driver circuit 10 operates correctly.

The measuring transistor 32 must be located and designed so that the transistor current is measured under conditions which correspond essentially to the conditions that determine the currents of the output transistors of the output branches 16A,16B,16C,16D. It is also possible to provide two or more measuring transistors for this purpose. The conductivity type and the w/1 ratio of the measuring transistor, its location, the supply voltage, etc. must be chosen accordingly. The current in the measuring device 30 is subjected to usual measures, such as smoothing.

The saturation current of the measuring transistor 32 is, under usual conditions, a sufficient measure of determining the correction signal K, which takes into account the above-mentioned parameters. Under usual operating conditions for MOS transistors, a first approximation of the saturation current of a MOS transistor having a gate-to-source voltage equal to the supply voltage $V_{DD}$, is inversely proportional to the rise or fall time of the output signal of the output transistors when the circuit is loaded by the capacitance 12. Thus, the rise or fall time is determined directly from the saturation current of the transistor 32. This is particularly advantageous with push-pull stages, since the rise and fall times are a function of load capacitance, supply voltage, temperature, and process status. For a simple push-pull stage, the following relationship is true:

$$tRF = \tau * \left[ \frac{2*VDD}{VDD - |VT|} - 2 + \ln\left(\frac{2*(VDD - |VT|)}{VH} - 1\right) \right],$$

with $$\tau = CL * \frac{1}{w*\beta} * (VDD - |VT|)^{-1},$$

where
VDD = supply voltage
VT = threshold voltage
VH = switching voltage swing
w = transistor geometry
β = transconductance
CL = load capacitance The correction signal K, which is determined from the measurement of the saturation current of the measuring transistor 32, is a measure of how much the setting signal S, determined by means of the numerical measure, must be corrected. This correction takes place in the setting means 24. The current of the measuring transistor 32 can be measured at a given measuring rate, which is preferably constant. What is important is that the measuring rate is small compared to the data rate of the output signal of the output stage 14, at which the data is transferred.

The setting means 24 includes the (A/D) converter 28 as described earlier. The A/D converter 28 converts the correction signal K into a digital one. The type of A/D converter 28 chosen is dependent on the way the correction signal K is generated. The A/D converter 28 is embodied as a counter. In this case, the numerical measure signal M is fed to the A/D converter 28 or the counter directly. The numerical measure signal M forms the start value for the counter. Depending on the magnitude of the current of the measuring transistor 32, the start value of the counter is increased or decreased. The magnitude of the current, and thus the count, determines the setting signal S directly. The counter may comprise a limiter, so that it operates in a limited control range. Overflows of the counter are then taken into account during signal evaluation.

The setting means 24 may also include an A/D converter 28 of a different kind. Then, only a processor is required to be present, e.g., in the setting means 24. The processor generates the setting signal S which is adapted to the process parameters by the numerical measure signal M and the correction signal K. The above calculation may be based on a table included in the program containing the interdependencies of corresponding process parameters. Alternatively, the above calculation is performed exactly, depending on the accuracy required in the respective application.

The setting signal S generated from the above processor contains only information on the number of output branches 16A,16B,16C,16D to be activated, but alternatively the setting signal S further includes information on which of the output branches 16A,16B,16C,16D is to be activated. The latter is appropriate if the output branches 16A,16B,16C, 16D are weighted differently as described earlier.

While the invention has been particularly shown and described with reference to preferred embodiments thereof, it will be understood by those skilled in the art that changes in form and details may be made therein without departing from the spirit and scope of the present invention.

What is claimed is:

1. An integrated driver circuit for driving (any) a given load capacitance, comprising:

an output stage having at least two parallel output branches, wherein each of said at least two parallel output branches includes a first transistor;

switching means coupled to said output stage for selectively turning on each of said at least two parallel output branches;

setting means coupled to said switching means for developing a setting signal that determines which of said at least two parallel output branches are selectively turned on; and an input device coupled to said setting means for enabling a user to select said given load capacitance by providing a number corresponding to said given load capacitance, wherein said input device develops a numerical measure signal according to said number provided by the user, said numerical measure signal is received by said setting means to develop said setting signal.

2. The circuit of claim 1, which further comprises control means for activating said output stage.

3. The circuit of claim 1, wherein each of said at least two parallel output branches include transistors having different w/1 ratios.

4. The circuit of claim 1, wherein each of said parallel branches further includes a second transistor coupled to said first transistor in a push-pull configuration.

5. The circuit of claim 1, which further comprises a measuring device coupled to said setting means for measuring an electrical quantity in order to develop a correction signal that corrects said setting signal for parameters that vary within said driver circuit in order to provide the optimum drive power.

6. The circuit of claim 5, wherein said electrical quantity is measured at a pre-determined frequency.

7. The circuit of claim 6, wherein said pre-determined frequency is less than an output data rate of said output stage.

8. The circuit of claim 5, wherein said electrical quantity measured is a rise time of an output signal of said output stage.

9. The circuit of claim 8, wherein said measuring device includes at least one measuring transistor, wherein said measuring device approximates said rise time of said output stage by measuring a saturation current of said measuring transistor.

10. The circuit of claim 9, wherein said setting means includes an analog to digital converter for converting said correction signal into a digital signal.

11. The circuit of claim 10, wherein said analog to digital converter is a counter for developing said setting signal from said numerical measure signal and said correction signal.

12. The circuit of claim 10, wherein said setting means includes a processor coupled to said analog to digital converter for developing said setting signal from said numerical measure signal M and said correction signal.

13. An integrated driver circuit for driving a given load capacitance, comprising:

an input device for enabling a user to select said given load capacitance by providing a number that corresponds to said given load capacitance, wherein said input device develops a numerical measure signal according to said number provided by the user;

setting means coupled to said input device for developing a setting signal which is proportional to said numerical measure signal; and output means coupled to said setting means for providing an output current that corresponds to said setting signal.

14. The circuit of claim 13, which further comprises control means for activating said output means.

15. The circuit of claim 13, wherein said output means includes at least two parallel branches and switching means for selectively turning on each of said at least two parallel output branches.

16. The circuit of claim 13, which further comprises a measuring device coupled to said setting means for measuring an electrical quantity in order to develop a correction signal that corrects said setting signal for parameters that vary within said driver circuit in order to provide the optimum drive power.

17. The circuit of claim 16, wherein said measuring device includes at least one measuring transistor, wherein said measuring device develops said correction signal according to a saturation current of said at least one measuring transistor.

18. The circuit of claim 17, wherein said setting means includes an analog to digital converter for converting said correction signal into a digital signal.

19. The circuit of claim 18, wherein said analog to digital converter is a counter for developing said setting signal from said numerical measure signal and said correction signal.

20. The circuit of claim 18, wherein said setting means includes a processor coupled to said analog to digital converter for developing said setting signal from said numerical measure signal and said correction signal.

* * * * *